United States Patent
Lavin et al.

(10) Patent No.: US 7,261,981 B2
(45) Date of Patent: Aug. 28, 2007

(54) SYSTEM AND METHOD OF SMOOTHING MASK SHAPES FOR IMPROVED PLACEMENT OF SUB-RESOLUTION ASSIST FEATURES

(75) Inventors: Mark A. Lavin, Katonah, NY (US); Lars W. Liebmann, Poughquag, NY (US); Scott M. Mansfield, Hopewell Junction, NY (US); Maharaj Mukherjee, Wappingers Falls, NY (US); Zengqin Zhao, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 504 days.

(21) Appl. No.: 10/707,778

(22) Filed: Jan. 12, 2004

(65) Prior Publication Data

US 2005/0153212 A1 Jul. 14, 2005

(51) Int. Cl.
 *G03F 1/00* (2006.01)
(52) U.S. Cl. ............................................. 430/5
(58) Field of Classification Search ................ 430/5, 430/394; 716/19–21
 See application file for complete search history.

(56) References Cited

U.S. PATENT DOCUMENTS

| | | | |
|---|---|---|---|
| 5,821,014 A | 10/1998 | Chen et al. | |
| 5,900,340 A * | 5/1999 | Reich et al. | 430/22 |
| 6,303,252 B1 | 10/2001 | Lin | |
| 6,413,683 B1 | 7/2002 | Liebmann et al. | |
| 6,416,907 B1 * | 7/2002 | Winder et al. | 430/5 |
| 6,492,097 B1 | 12/2002 | Chen et al. | |
| 6,495,435 B2 | 12/2002 | Templeton et al. | |
| 6,519,760 B2 | 2/2003 | Shi et al. | |
| 6,541,165 B1 | 4/2003 | Pierrat | |
| 6,627,361 B2 | 9/2003 | Bula et al. | |

OTHER PUBLICATIONS

Granik et al., "Two dimensional G-MEEF Theory and Applications," Proceedings of SPIE—The International Society for Optical Engineering v.4754 2002 p. 146-155.
LaCour et al., "Model-Based OPC For Sub-Resolution Assist Feature Enhanced Layouts," Proceedings of SPIE—The International Society for Optical Engineering, 2002.
Joesten et al., "The Effect Of Scattering Bar Assist Features In 193 Nm Lithography," Optical Microlithography XV. Proceedings of SPIE—The International Society for Optical Engineering v.4691 II 2002, p.861-870.
Shi et al., "Understanding The Forbidden Pitch Phenomenon And Assist Feature Placement," Metrology, Inspection, and Process Control for Microlithography XVI. Proceedings of SPIE—The International Society for Optical Engineering v.4689 II 2002 p. 985-996.

(Continued)

*Primary Examiner*—S. Rosasco
(74) *Attorney, Agent, or Firm*—Todd M. C. Li; Daryl Neff

(57) ABSTRACT

A method is disclosed for providing associated shapes of an optical lithography mask in relation to predetermined main shapes of the mask. The method includes generating simplified layout patterns from the predetermined main shapes of the mask. Such layout patterns are generated by eliminating detail of the main shapes which leads to unmanufacturable associated shapes while preserving geometrically relevant shape information. The associated shapes are then generated relative to the simplified mask patterns.

17 Claims, 12 Drawing Sheets

OTHER PUBLICATIONS

Reblinsky et al., "Lithographic Comparison Of Assist Feature Design Strategies," Optical Microlithography XV Santa Clara, CA, USA Mar. 5-8, 2002.

Smith, "Mutually Optimizing Resolution Enhancement Techniques: Illumination, APSM, Assist Feature OPC, And Gray Bars," Optical Microlithography XIV. Proceedings of SPIE—The International Society for Optical Engineering v.4346 N.1 2001 p. 471-485.

Liebman et al., "Optimizing Style Options For Sub-Resolution Assist Features" Optical Microlithography XIV. Proceedings of SPIE—The International Society for Optical Engineering v.4346 N.1 2001 p. 141-152.

Chen et al., "Template of Specifications for Assist Feature Script Implementation", Proceedings of SPIE—The International Society for Optical Engineering, v.4754 2002 p.156-166.

* cited by examiner

SYSTEM AND METHOD OF SMOOTHING MASK SHAPES FOR IMPROVED PLACEMENT OF SUB-RESOLUTION ASSIST FEATURES

BACKGROUND OF INVENTION

Due to its high volume yield, optical microlithography appears to remain the method of choice for patterning microelectronic and other micro-scale chips for the foreseeable future. However, high yields can only be maintained through optical microlithography if the size of the process window is maintained large. The process window characterizes permitted variances of the dose and focus relative to the nominal dose and focus used to imprint mask features on the wafer. The nominal dose and focus are typically determined empirically by printing a critical dimension mask shape on a substrate, e.g. semiconductor wafer, and verifying that the critical dimension is achieved. Since in the mass production of chips, it is never possible to guarantee that the nominal dose and focus are maintained, the circuit layout and mask generation processes must be designed to provide an adequately large process window. In such manner, the circuit resulting from the lithographic patterning will meet performance goals, despite variations in the dose and the focus.

Resolution enhancement techniques (RETs) are among known techniques used to increase the process window associated with the lithographic process. The generation and placement of sub-resolution assist features (SRAFs) (also referred to as scattering bars in some literature) on photomasks is one of the most popular RETs in the deep sub-micron (below 100 nm) lithography technology for manufacturing chips having very large scale integration (VLSI). SRAFs are additional rectangular shapes that are placed on masks along the length or the extent of main mask shapes in deep sub-micron lithography. The SRAFs do not print themselves but help to improve the process window for wafer printing by improving the depth of focus of the mask shapes. FIG. 1 is a top down view illustrating the placement of SRAFs 11, 12, 13 and 14 along sides of a main mask shape 10. FIG. 1 illustrates a particular type of SRAF known as "same tone". The shapes on a photomask can have either one of two tones: clear (permitting the light to pass) and opaque (blocking the light). The main mask shapes can be either clear or opaque, such as depends on whether the photoresist of the wafer to be patterned is a positive or a negative resist. Same tone SRAFs have the same tone as the main mask shape that they assist. Thus, in the same tone arrangement illustrated in FIG. 1, the mask shape 10 and the SRAFs 11-14 are all either clear or opaque features.

Instead of having the same tone, SRAFs can have the opposite tone as the main mask shape that they assist. When the SRAF has the opposite tone than the main features, they are referred to as "opposite tone" SRAF. In this case, an SRAF can be considered as being holes in the main feature. FIG. 2 is a top down view illustrating an example of a main mask shape 20 which is assisted by the opposite tone SRAFs 21-23. Hereinafter, as illustrated in FIGS. 1 and 2, SRAFs are illustrated as shapes of a mask in addition to the main mask shapes.

In addition to masks having same tone SRAFs and masks having opposite tone SRAFs, both same tone and opposite tone SRAFs may be present together in the same mask. This type of SRAFs is referred to as dual tone SRAFs. An example of dual tone SRAF is shown in the plan view provided in FIG. 3. As shown therein, same tone SRAFs 26 and 28 are placed external to the main mask shapes 30, 32 and 34, along the length of the main mask shapes. Opposite tone SRAFs 31, 33, and 35 are also provided internal to each of the main mask shapes 30, 32 and 34.

Different nomenclature is sometimes used in literature instead of that used above. For example, if SRAFs occupy a clear region in the mask they are referred to as clear SRAFs and if they occupy a dark region in the mask they are referred to as dark SRAFs or opaque SRAFs. Often opaque SRAFs are referred to as positive tone SRAFs and clear SRAFs are referred to as the negative tone SRAFs.

Hereinafter, the term SRAF will be used to refer to all such SRAFs, whether they have the same tone or the opposite tone as the main mask shapes that they assist, unless reference is made specifically to SRAFs having the same tone or opposite tone.

Conventionally, SRAFs are placed on a mask in accordance to a rule table used by lithographic engineers. The rule table dictates the following things: a) the number of SRAF to be placed along an edge of a mask shape or a fraction of an edge of a main mask shape; b) the distance of the SRAF from the edge of the mask shape it is assisting; c) the width of the SRAF; and d) the distance between two SRAFs, if there is more than one SRAF along an edge.

The rule table that is used for SRAF placement decides the above five items on a one dimensional criterion of the allowable space between two neighboring opposite-facing main mask shapes.

In addition to that, there are several mask manufacturing constraints that decide the location, and the size of the SRAF. These mask manufacturing rules may decide the following items: a) the minimum area of each SRAF; b) the minimum width of each SRAF; c) the minimum length of each SRAF; and d) the minimum distance between an SRAF and a main feature or another SRAF: The distance can be characterized by design rule checking (DRC) directives. Some examples of DRC directives are: corner-to-corner checks and end-to-end checks.

According to commonly used methods, SRAFs are placed on a mask as follows: a) placing SRAFs using the rule table; b) cleaning up, i.e. reshaping and/or deleting SRAFs that can create catastrophic conditions, such as printing of the SRAF on the wafer (SRAFs are intended not to be printed on the wafer, but rather to help in better print the main features on the wafer); and c) cleaning up, i.e. reshaping, SRAFs having mask rule violations that remain on the mask after step b). An SRAF exhibits a mask rule violation when the SRAF shows any one or more of the following: any side (defined as any bounding line segment) of the SRAF has less than minimum width according to mask manufacturing constraints, or any side of the SRAF is placed so close to another mask shape (either main mask shape or another SRAF) that there is less than a minimum spacing between that SRAF and the other mask shape.

A conventional method of placing of SRAFs is illustrated in the flow diagram of FIG. 4. As shown therein, the conventional method begins with the generation of the main shapes of the mask from a set of design data defining a circuit layout, as shown at block 50. A set of rule tables for the generation of SRAFs and a set of mask manufacturing rules are also provided at this time, as also shown at block 50. From the main shapes and the SRAF rule tables, SRAFs are generated for the mask, as shown at block 52. Next, as shown at block 54, an individual SRAF is considered. The individual SRAF is checked against the mask manufacturing rules, at block 56. That is, it is determined whether the individual SRAF violates minimum spacing rules relative to any other shape of the mask, and whether the shape of the individual SRAF violates minimum width rules.

If the decision is that the SRAF satisfies the mask rules, i.e. the decision is "yes" that the SRAF does not have mask rule violations, then the SRAF is allowed to remain on the mask. At block 60, it is then determined whether any other SRAF of the remains to be considered. If there remains an unconsidered SRAF, then another SRAF of the mask is considered in turn, as shown at block 57. However, if the decision is "no", i.e., that the SRAF does show mask rule violations, then the SRAF is deleted from the mask, as shown at block 58. Thereafter, it is determined whether any other SRAF of the remains to be considered, at block 60. Again, if any unconsidered SRAF remains, then another SRAF of the mask is considered in turn, as shown at block 57. On the other hand, once all of the SRAFs of the mask have been considered, data representing the SRAFs are output, at block 62.

Unfortunately, the algorithm according to the prior art is quick to delete SRAFs upon discovery of mask rule violations. Stated another way, the algorithm does not favor preservation of SRAFs, but rather, preserves only those SRAFs which do not have mask violations when viewed in relation to the initial main mask shapes. As a result, many a mask edge is often left unassisted by an SRAF, and the process window is consequently diminished.

The challenge of mask clean-up, i.e. the process of removing mask rule violations, is exacerbated by the tendency for the spacings between the SRAF and the edges of mask shapes to vary in width. In regions where the spacing width has a high rate of variation, the length of the SRAFs and the total mask area of the SRAFs becomes small. Unfortunately, by the prior art method described above with respect to FIG. 4, small SRAFs are eventually deleted from the mask during the mask clean-up process as violating minimum width and/or minimum spacing rules.

An example of this problem of mask clean-up according to the prior art method is illustrated in FIGS. 5A and 5B. FIG. 5A illustrates a set of main shapes 70, 72 of a mask and corresponding opposite tone SRAFs 71 and 73, prior to performing any mask clean-up process. The main shapes 70, 72 extend from first edges 74 to second edges 75 in a horizontal direction 78 across a main surface of the mask. The SRAFs 71, 73 also extend from first edges 74 to second edges 75 in the horizontal direction 78. However, the irregular outline of the main shapes 70, 72 in areas 77 near edges 75 causes the SRAFs 71, 73 in those areas 77 to be jogged.

FIG. 5B illustrates the resulting main shapes 70, 72 and SRAFs 81, 83 after mask clean-up. During clean-up, each portion of the SRAFs 71, 73 is considered individually as to whether it satisfies mask rules 56, according to the process illustrated in FIG. 4. As a result of the clean-up process, the SRAFs 81, 83 are pulled back a desirable distance from the edges 74, leading to better printing of the main shapes 70, 72. However, near the edges 75, the areas 77 where the SRAFs 71, 73 are jogged have mask violations. Following the clean-up process, the resulting SRAFs 81, 83 do not appear at all in the areas 77, leaving the edges 75 of the main shapes 70, 72 unassisted by the SRAFs 81, 83. This is clearly an undesirable result, as the process window is substantially decreased.

FIG. 6 illustrates the results of mask clean-up according to a modified processing method. Referring again to FIG. 5A, in such method, known as "partial smoothing," the jogged portions 77 are first smoothed, i.e. straightened, prior to testing them against mask manufacturing rules for minimum feature width and spacing. Then, after the subsequent mask clean-up process, more of the once jogged portions 77 of the SRAFs 71, 73 remain as the final SRAF shapes 91, 92, 93 and 94 of the mask. In this case, reasonable assist coverage is achieved while satisfying the mask manufacturing constraints rules.

Another example of the results of the mask clean-up process is illustrated in FIGS. 7 and 8. As shown in FIG. 7, the main mask shapes 101, 102 are more complicated than in previous examples, and have non-uniform spacing with respect to each other and within each main mask shape. As a consequence, the opposite tone SRAFs 103 and 104 which are generated to assist the main mask shapes are very small. After mask clean-up, as shown in FIG. 8, the resulting main mask shapes 101, 102 are left unassisted. This again is undesirable, as the process window for printing the main shapes is narrowed. It would be desirable instead for SRAFs to remain sufficiently after the mask clean-up process in such size that they actually assist the lithography process window as intended. Such situation is illustrated in FIG. 9 in which the resulting SRAFs 114 are still large enough and in sufficient quantity to genuinely help to maintain the process window.

The problem of missing SRAFs as demonstrated in all the above examples frequently arises from the non-uniform spacings in which SRAFs are placed. In many cases, the nonuniformity arises from dents, jogs, or channels in the main mask shapes that the SRAFs are intended to assist, or in some combination thereof. However, these small variations, in truth, should not cause SRAFs to be deleted or significantly shortened from the mask, as is so often the case according to the mask clean-up methods described above with respect to FIGS. 1-9.

Accordingly, it would be desirable to provide a method for systematically smoothing, i.e. removing non-uniformities of, main mask shapes prior to that are intended to assist them.

It would further be desirable to provide a method for generating reasonably sized SRAFs for assisting the smoothed main mask shapes.

SUMMARY OF INVENTION

According to an aspect of the invention, A method is provided for generating associated shapes of an optical lithography mask in relation to predetermined main shapes of the mask. The method includes generating simplified layout patterns from the predetermined main shapes of the mask. Such layout patterns are generated by eliminating detail of the main shapes which leads to unmanufacturable associated shapes while preserving geometrically relevant shape information. The associated shapes are then generated relative to the simplified mask patterns.

According to a particular aspect of the invention, a method is provided in which the simplified layout patterns are generated for each of the predetermined main shapes by:

defining a quantity X based on the critical dimension of the shape and the lithographic process;

shrinking from every side by a quantity X at least once;

growing on every side by the quantity X at least once;

preserving a common region between the predetermined main shape and the resulting shape after the shrinking and the growing; and, if any feature smaller than the quantity X remains, reducing the quantity X and repeating shrinking, the growing, and preserving the common region until no feature smaller than the quantity X remains.

DETAILED DESCRIPTION

An objective of the embodiments of the invention described herein is to provide a method and system by which associated or subordinate shapes of a mask are generated more reliably. Thus, according to embodiments of the invention, smoothed versions of the main mask shapes are generated, in relation to which the associated or subordinate shapes are generated, which are better suited to withstanding a mask clean-up process thereafter. By "smoothing" is meant the removal of non-uniformities in the shapes. In an embodiment of the invention, the removal of non-uniformities is performed by a series of growth and shrink operations on the main features. Then, regions that are common to both the original main mask shapes and the outcome of the growth and shrink operations are kept as the smoothed versions of the main mask shapes.

FIGS. 10-19 illustrate embodiments of the invention in which growth and shrink operations are performed to reduce non-uniformities in the main mask shapes. In particular embodiments, the growth and shrink operations are performed in ways that are known as Minkowski's sum and Minkowski's difference.

Figure 10:
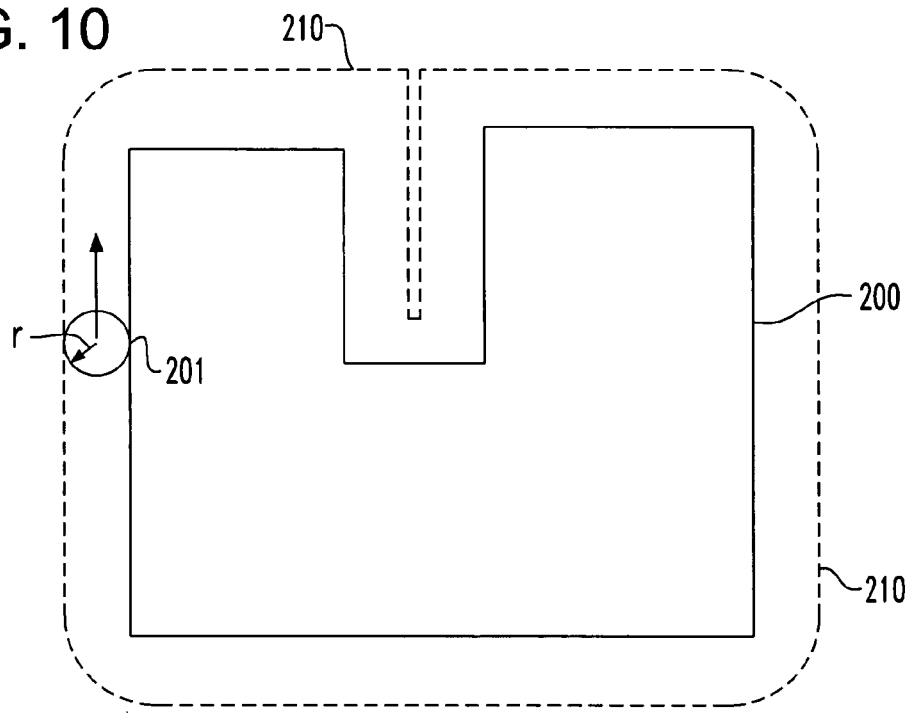
FIG. 10 illustrates a principle of growth of a shape according to a Minkowski's sum.
Figure 11:
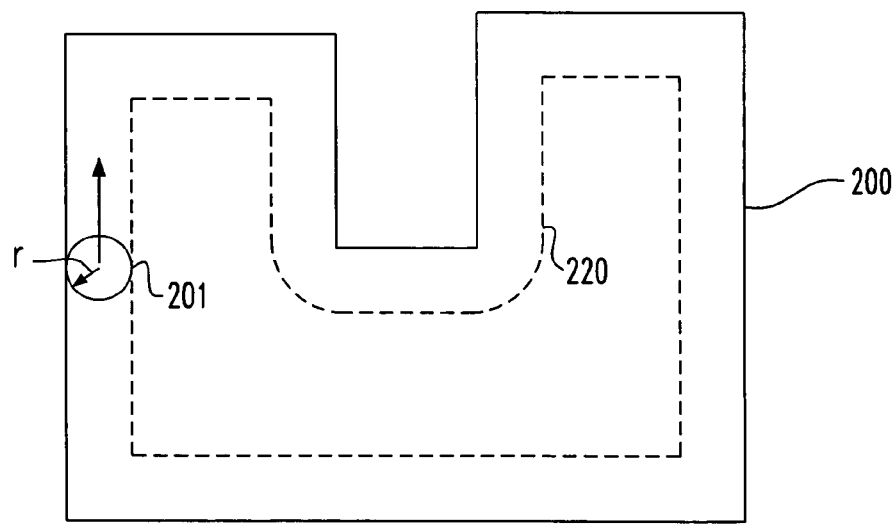
FIG. 11 illustrates a principle of shrinking of a shape according to a Minkowski's difference.

Referring to FIG. 10, Minkowski's sum 210 on an object 200 in the two dimensional Euclidean domain is defined by rolling a ball of radius r along the exterior boundary of the object 200 and taking the point-set union of the original object and the area swept by the rolling ball. Referring to FIG. 11, Minkowski's difference 220 on an object 200 in the two dimensional Euclidean domain is defined by rolling a ball of radius r along the interior boundary of the object and taking the point-set difference of the area swept by the rolling ball from the original object.

In semiconductor wafer processing, the shapes of a mask are generally orthogonal. That is they have some edges which are parallel to the X axis and other edges which are parallel to the Y axis, and comparatively few edges, if any, which are not parallel to either the X axis or the Y axis. Thus, mask shapes actually vary over a more limited orthogonal or "Manhattan" domain in which edges run in an up-down (vertical) direction across the surface of the mask, or a back-and-forth direction across the mask surface.

Figure 12:
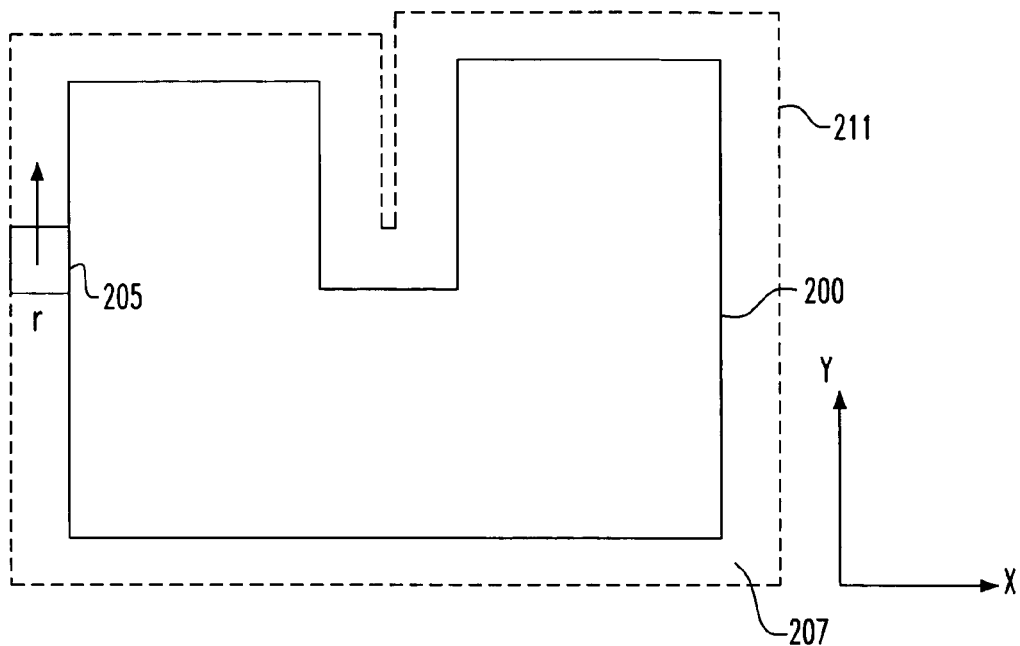
FIG. 12 illustrates a principle of growth of a shape according to a Minkowski's sum in an orthogonal domain.

In the orthogonal domain, any curved shapes created by the Euclidean Minkowski's sum and Minkowski's difference would not be very useful, as they would lead to difficulties in manufacturing the mask and patterning the wafer. Therefore, Minkowski's sum and Minkowski's difference need to be defined differently for the orthogonal domain. As shown in FIG. 12, Minkowski's sum 211 is defined in the two dimensional orthogonal (Manhattan) domain by sliding a square 205 having a side of length r along the exterior boundary of an object 200 having edges parallel to the x and the y axes, and taking the point-set union of the original object 200 and the area 207 swept by the sliding square.

Figure 13:
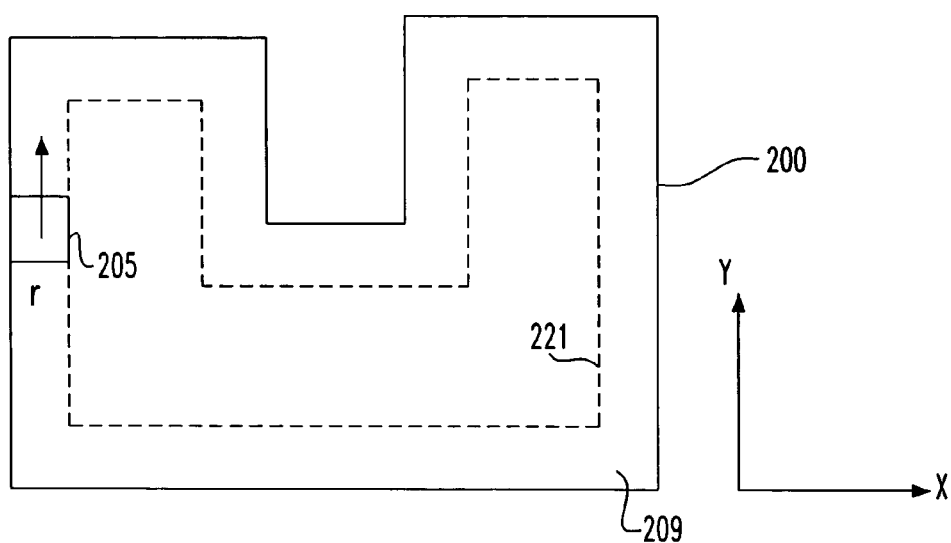
FIG. 13 illustrates a principle of shrinking of a shape according to a Minkowski's difference in an orthogonal domain.

As shown in FIG. 13, Minkowski's difference 221 is defined in the two dimensional orthogonal (Manhattan) domain by sliding a square 205 having a side of length r along the exterior boundary of an object 200 having edges parallel to the x and the y axes, and taking the point-set difference 221 of the area 207 swept by the sliding square from the original object 200.

Figure 14:
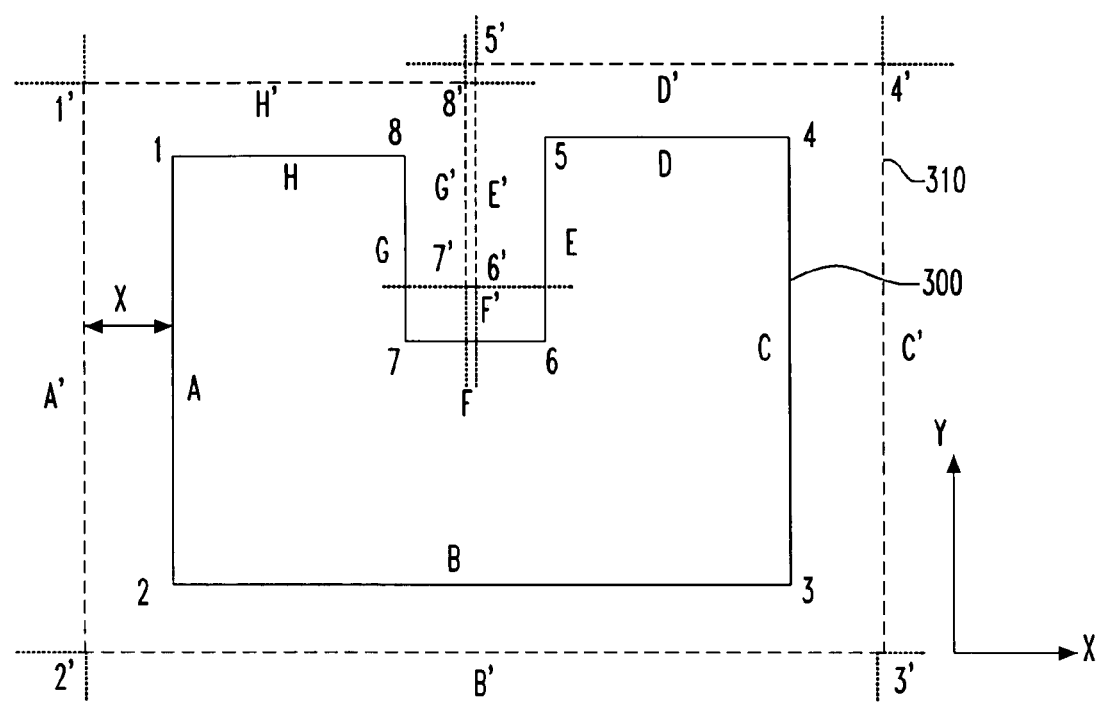
FIG. 14 further illustrates a result of growth according to a Minkowski's sum.

As used herein in relation to semiconductor wafer processing, Minkowski's sum and difference refer to these operations in the orthogonal domain, as described with reference to FIGS. 12 and 13. Referring now to FIG. 14, note that the Minkowski's sum 310 can as well be implemented by moving the edges of a polygon 300 outwardly by a specified value X and finding the area as enclosed by the intersection of the edges as now moved. In FIG. 14, the original polygon 300 consisting of 8 edges A through H are shown in solid lines. The vertices of the original polygon are 1 through 8. Each edge A through H is moved outwardly from the original shape 300 by a value X. The resulting infinite lines A' through H' are shown by dotted lines. Here A' is created by moving A by an value X, B' is created from B, so on and so forth. Vertices 1' through 8' are created by intersecting these infinite lines. For example, in the original polygon vertex 1 is at the intersection of edges A and B. Therefore, vertex 1' is created at the intersection of lines A' and B'. In the illustrative example of FIG. 14, edges H and D are shown having different y coordinates, in order to show the lines H' and D' clearly. In a real example, edges H and D usually have the same y coordinates. Finally, Minkowski's sum is the new grown polygon 310 (shown in dashed line), created by joining the newly created vertices 1' through 8'. Such operation is hereinafter referred to as the grow operation.

Figure 15:
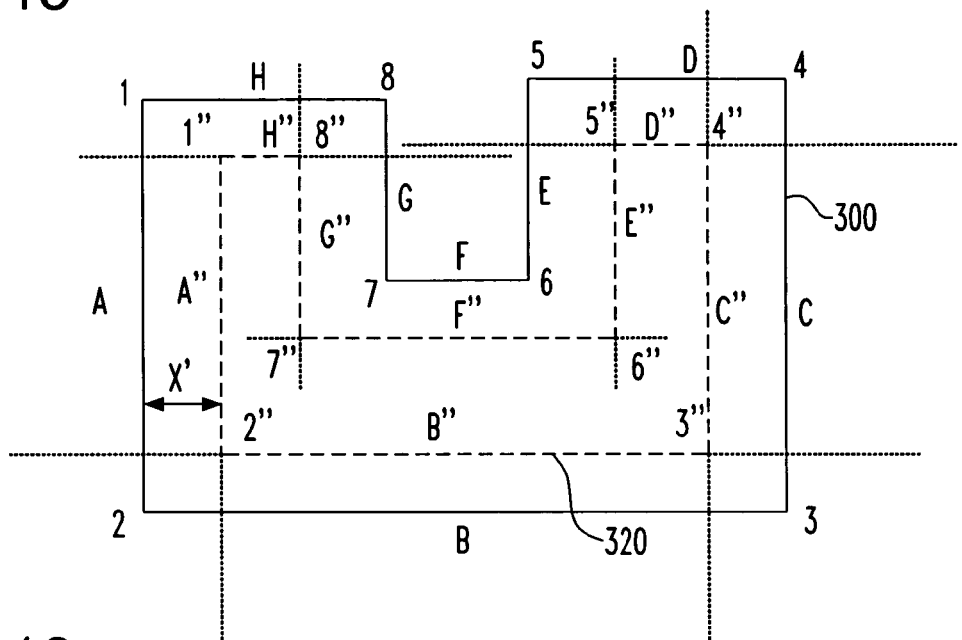
FIG. 15 further illustrates a result of shrinking according to a Minkowski's difference.

Similarly, as shown in FIG. 15, Minkowski's difference can as well be implemented by moving the edges of the polygon 300 inwardly by a specified value X' and finding the area as enclosed by the intersection of the edges as now moved. In FIG. 15, taking the intersection of the edges as shown in the figure below. In FIG. 15, the original polygon consisting of 8 edges A through H are shown in solid lines. The vertices of the original polygon are 1 through 8. Each edge A through H is moved towards the inside of the polygon 300 by a value X'. The resulting infinite lines A" through H" are shown by dotted lines. Here A" is created by moving A by an value X" interior to the polygon, B" is created from B, so on and so forth. Vertices 1" through 8" are located at the intersections of these infinite lines. For example, in the original polygon 300 vertex 1 is at the intersection of edges A and B. Therefore, vertex 1" is created at the intersection of lines A" and B". In the illustrative example of FIG. 15, edges H and D are shown having different y coordinates, in order to show the lines H" and D" clearly. In an example of a real mask shape, edges H and D usually have the same y coordinates. Finally, Minkowski's difference is the new shrunken polygon 320 (shown in dashed line), created by joining the newly created vertices 1" through 8". Such operation is hereinafter referred to as the shrink operation.

Figure 16:
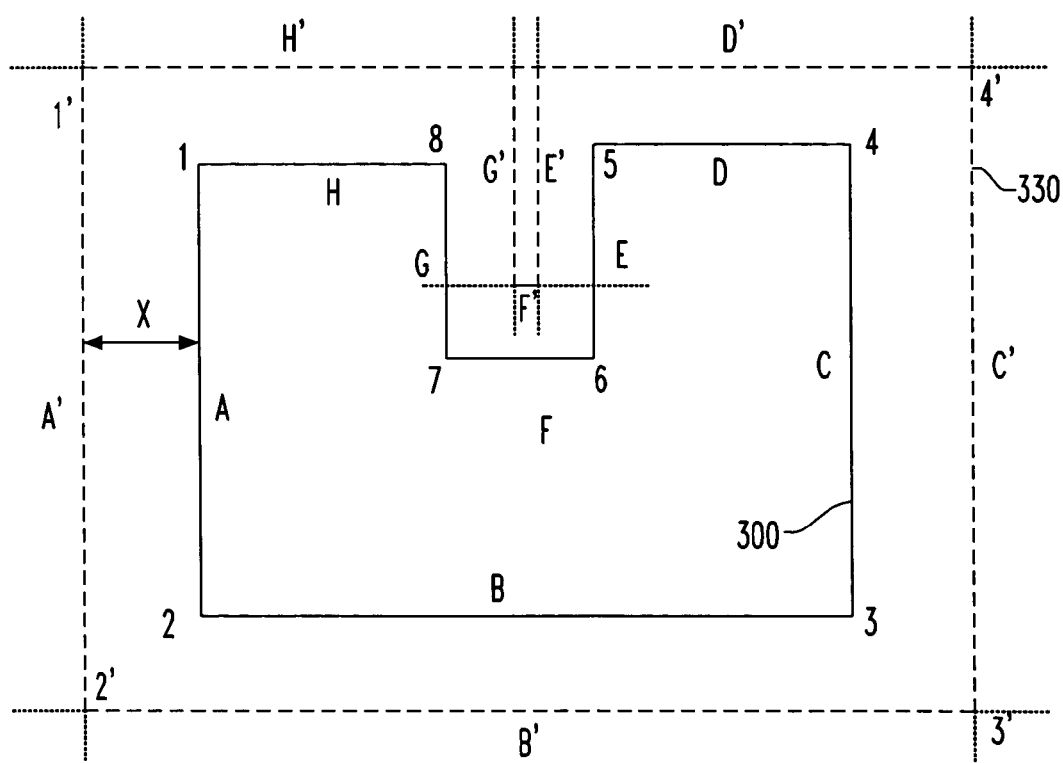
FIG. 16 further illustrates a result of eliminating an indentation by growth according to a Minkowski's sum.

As a result of the grow operation or the shrink operation, the grown or the shrunken polygon may not have all the characteristics of the original polygon. If the value X by which the polygon is grown in the example shown in FIG. 14 were somewhat higher, the indentation in the original polygon 300 having edges E, F and G may not appear in the grown polygon. This is illustrated in FIG. 16. Here, the intersection order of the moved lines E' and G' with the line F' has switched. This indicates that the growth value X is larger than the dimension of the indentation and that the indentation is filled up after the growth operation. The resulting vertices after the grow operation are now only 1' through 4' and the grown polygon 300 having the filled up indentation is shown in dashed line.

According to embodiments of the invention, one or more grow operations followed by one or more shrink operations are performed in order to smooth a main mask shape before creating SRAFs for that mask shape. Alternatively, one or more shrink operations followed by one or more grow operations are performed to smooth the main mask shape prior to creating the SRAFs. The value X by which the mask shape is grown or shrunken in each operation X is preferably determined in relation to the minimum edge size. For example, if the critical (minimum) dimension of features of the mask is 100 nm, the value X is determined in proportion thereto, having a value such as 10 nm.

Figure 17:
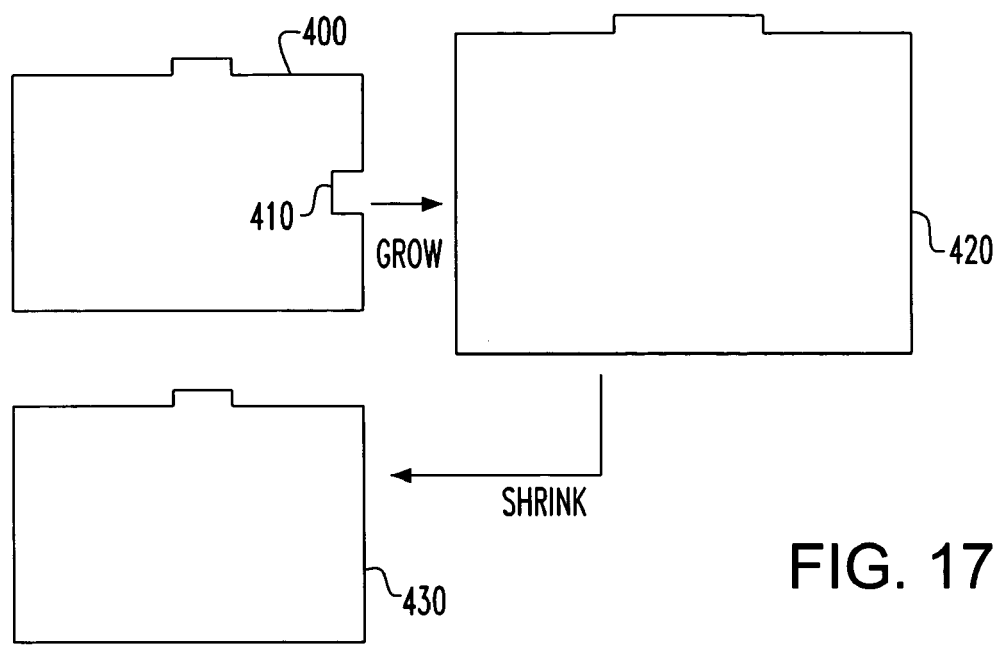
FIG. 17 illustrates the performance of a grow operation followed by a shrink operation to remove an indentation according to an embodiment of the invention.

For example, as illustrated in FIG. 17, when the grow operation is performed to grow a mask shape 400 by a pre-determined amount, a small indentation 410 within the shape 400 disappears in the grown shape 420. When the mask shape is thereafter shrunken again, preferably by the same predetermined amount by which it was grown before, a smoothed mask shape 430 appears having a desirable size, and which no longer has the indentation.

Figure 18:
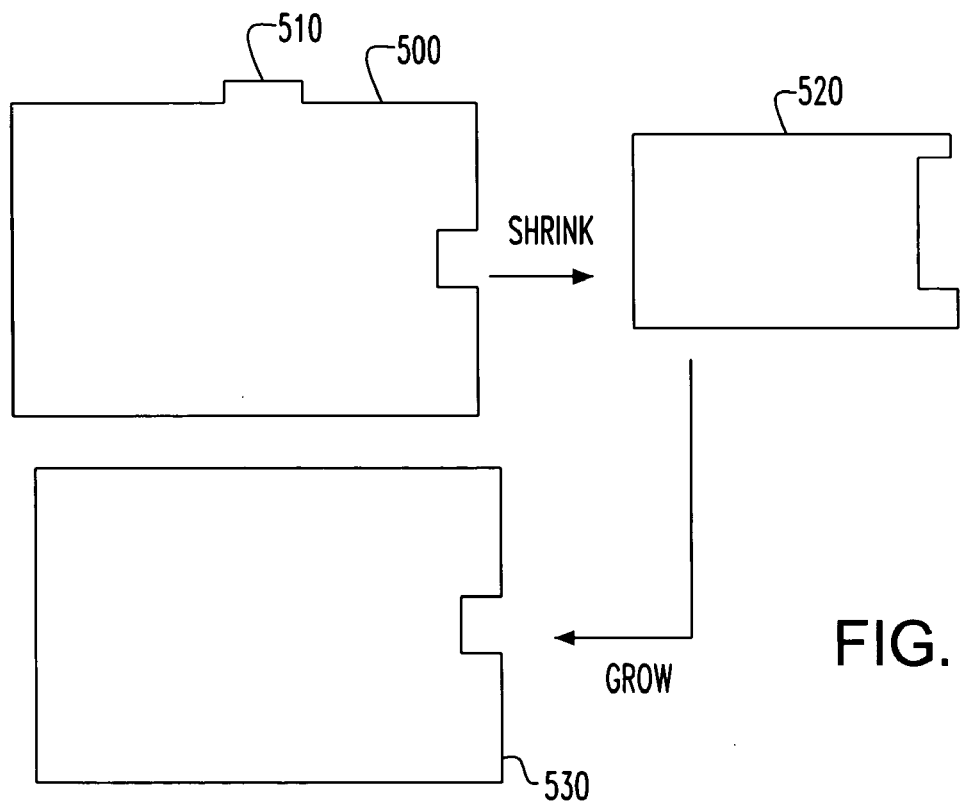
FIG. 18 illustrates the performance of a shrink operation followed by a grow operation to remove a protrusion according to an embodiment of the invention.

On the other hand, as in the example illustrated in FIG. 18, when the shrink operation is performed to shrink a mask shape 500 by a predetermined amount, a small protrusion 510 on the shape 500 disappears in the shrunken shape 520. When the mask shape is thereafter grown again, preferably by the same predetermined amount by which it was shrunken before, a smoothed mask shape 530 appears having a desirable size, and which no longer has the protrusion.

From the above discussion, if a sequence of one or more grow operations is performed to the mask shape, followed by one or more shrink operations, small indentations are removed from the mask shape. Also, if a sequence of one or more shrink operations is performed to the mask shape, followed by one or more grow operations, small protrusions are removed from the mask shape. Then, if both such sequences are performed of a grow operation followed by a shrink, and a shrink followed by a grow operation, then both small indentations and small protrusions are removed from the mask shape.

Figure 19:
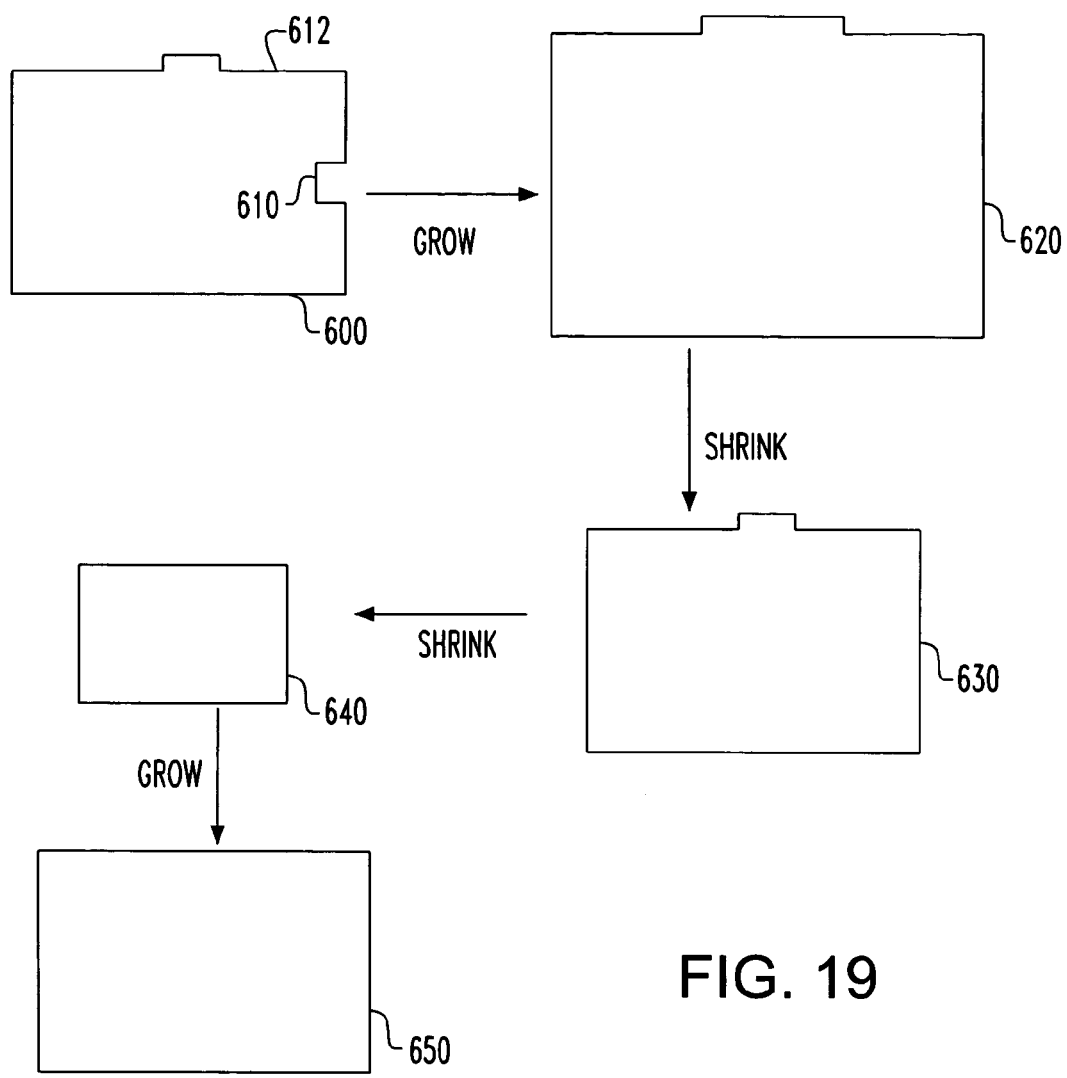
FIG. 19 illustrates the performance of multiple grow operations and multiple shrink operations to remove both an indentation and a protrusion, according to an embodiment of the invention.

This is illustrated in FIG. 19 in which an original mask shape 600 having an indentation 610 and a protrusion 612 is grown by a predetermined amount to an enlarged shape 620 in a first operation, resulting in removal of the indentation 610. Thereafter, the enlarged shape 620 is shrunken by the predetermined amount, resulting in the modified shape 630 in which the indentation 610 no longer appears. Thereafter, a further shrink operation is performed, which results in the shrunken shape 640 in which neither the indentation nor the protrusion appears. Thereafter, a further grow operation is performed to enlarge the shape 640 again to a final size shape 650 for placement on the mask.

In the above-described embodiment of the invention, two grow operations and two shrink operations are performed to provide a smoothed main shape 650 of the mask modified from the original mask shape 600 having both an indentation and a protrusion.

According to another embodiment of the invention, an algorithm is provided for smoothing main shapes for placement on a photomask, prior to placement of SRAFs thereon. This embodiment is similar to that described above with respect to FIG. 18 in that the shrink operation is performed prior to the grow operation. The steps performed according to such embodiment are as follows:

1. Select a value of the value X to be used to smooth mask shapes. The value of X depends on the critical dimensions (CD) of the main features on the mask shape, the lithographic process conditions and the mask rules. For example, for a mask having a critical dimension of 140 nanometers (nm), under typical lithographic process conditions, node X can be as large as 20 nanometers (nm).

2. Thereafter, the shapes are shrunken by the value X from all edges.

3. Thereafter, the shapes resulting from step 2 are grown by the value X at all edges.

4. Thereafter, the common region of shapes resulting from step 3 with the original shapes is taken by a Boolean AND (point-set intersection) operation. Since the SRAFs are always put in with reference to the main features, we need to ensure that the final shapes after the series of Grow and Shrink operations do not fall out side the region originally covered by the SRAF. The point-set AND or the intersection operation ensures that.

5. Thereafter, it is determined whether any edge of a shape remains which has a dimension smaller than X.

6. If such edge of a shape remains having a dimension smaller than X, then the value X is changed to a smaller value, i.e., by halving the current value of X; and 7. Steps 2 through 6 are repeated in order again until no edge remains which has a dimension smaller than the current value X.

The above algorithm is the basis for a method embodiment of the invention. According to such embodiment, an improved method provides shapes of a mask including both main shapes and SRAFs which assist printing of the main shapes. Such method is illustrated in the flowchart of FIG. 20.

Figure 20:
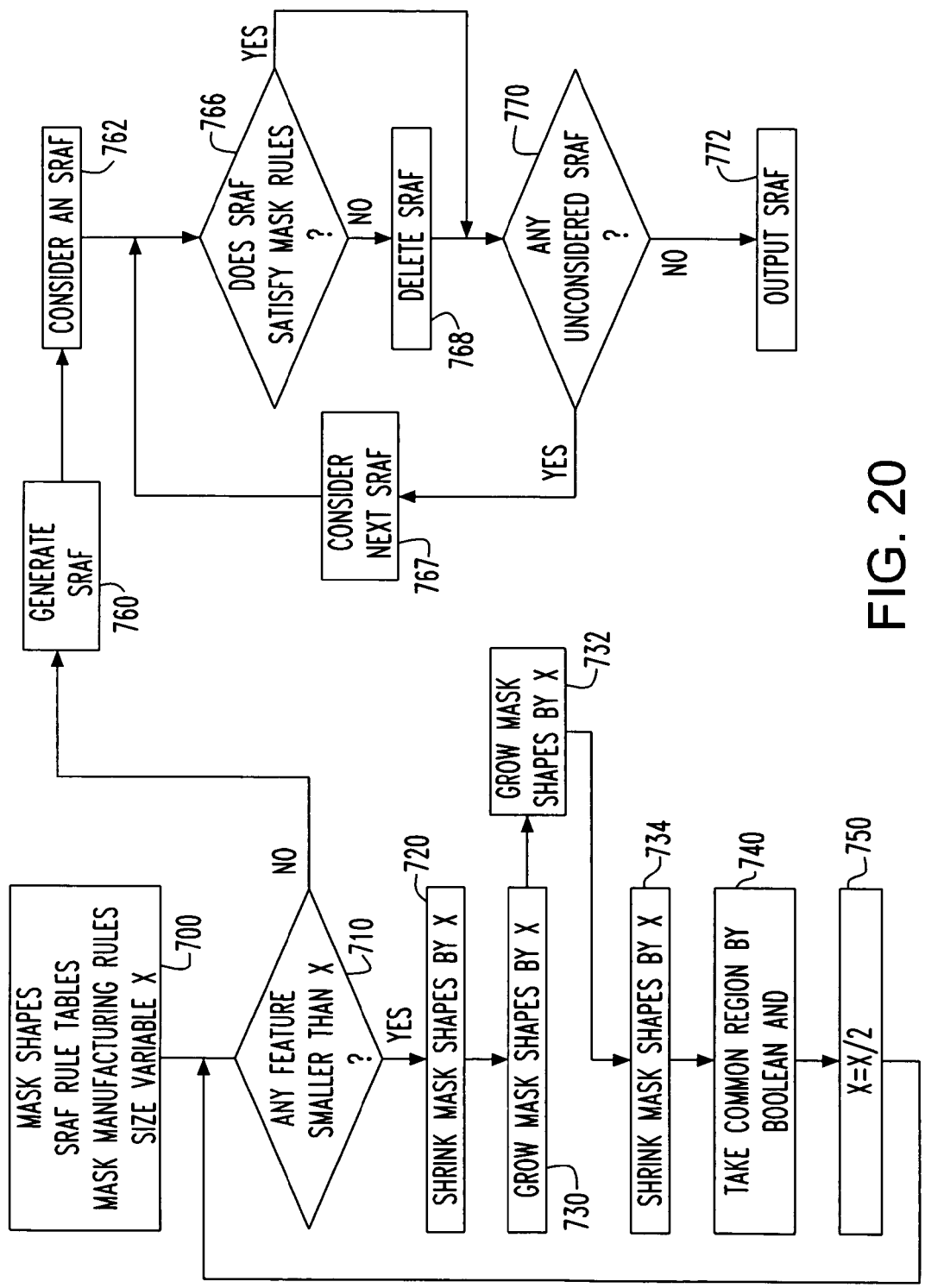
FIG. 20 illustrates a method of generating smoothed versions of main mask shapes, in relation to which are set of associated features are provided, according to an embodiment of the invention

As shown in FIG. 20, at block 700 the main shapes of the mask are provided, as from a set of design data defining a circuit layout. A set of rule tables for generation of SRAFs and a set of mask manufacturing rules are also provided at this time, as also shown at block 700. However, none of the SRAFs or other associated or subordinate shapes of the mask are generated just yet. The SRAFs or other shapes of the mask are placed on the mask in relation to smoothed versions of the main mask shapes. Those smoothed versions must first be generated from the main mask shapes. The initial value of X by which the main mask shapes are to be grown or shrunken in the shrink and grow operations is provided at this time, as well, as also shown at block 700.

Thereafter, at block 710, it is determined whether any of the main mask shape of the mask has an edge that is smaller than the current value of X. If the decision is "No", processing proceeds, at step 760, with the generation and checking of SRAFs for placement on the mask. More will be described on the generation and checking of the SRAFs below. However, if the decision is "Yes", that features do appear on the mask shapes that are smaller than the value X, the shrink and grow operations are applied in order to remove such features from the mask shapes. In this embodiment, the mask shapes are first shrunk by the value X, at block 720. Thereafter, at block 730, the mask shapes are grown by the value X. The shrink operation at block 720 followed by the grow operation at block 730 results in indentations being removed from the main mask shapes.

Following the grow operation at block 730, an additional grow operation is performed, at block 732, in which the mask shapes are grown again by the value X, and an additional shrink operation is performed, at block 734, in sequence with the grow operation. The grow operation at block 732 followed by the shrink operation at block 734 results in protrusions being removed from the main mask shapes. The shrink operation followed by the grow operation results in a smoothed mask shape in which protrusions in the initial the main mask shape are removed that are smaller than the value X.

Thereafter, as shown at block 740, an operation is performed to find the region in common between each smoothed main mask shape that results after the shrink and grow operations and the initial mask shape provided at block 700. The purpose of this step is to assure that, after this process, the smoothed version of the main mask shape does not end up having an edge which lies outside of original mask shape. At step 750, the value of X is reduced to a smaller value, i.e. half of its current value to X/2, and another iteration of the process is performed from step 710 with respect to the smoothed versions of the mask shapes resulting from processing thus far. The process continues as to the main mask shapes as described above relative to blocks 710 through 750, until no edges of any of the smoothed versions of mask shapes remain which are smaller than X, and no small shapes are left out of the mask.

Figure 1:
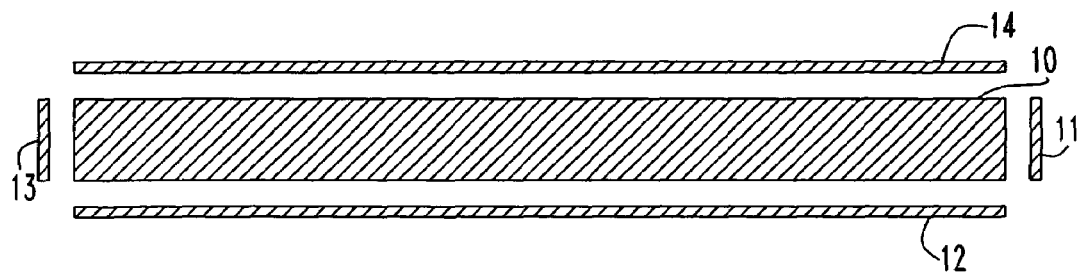
FIG. 1 illustrates a set of main shapes of a mask, in relation to which sub-resolution assist features (SRAFS) are provided.
Figure 2:
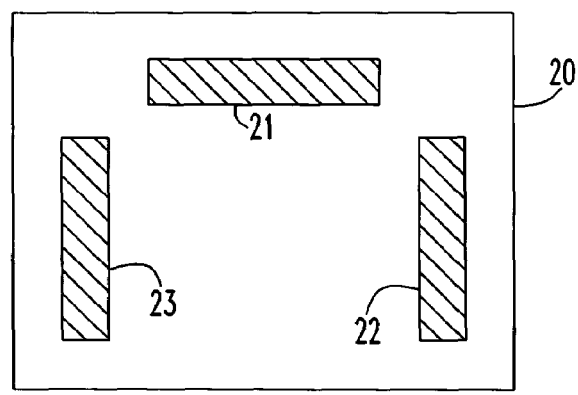
FIG. 2 illustrates a main shape of a mask, in relation to which opposite tone sub-resolution assist features (SRAFS) are provided.
Figure 3:
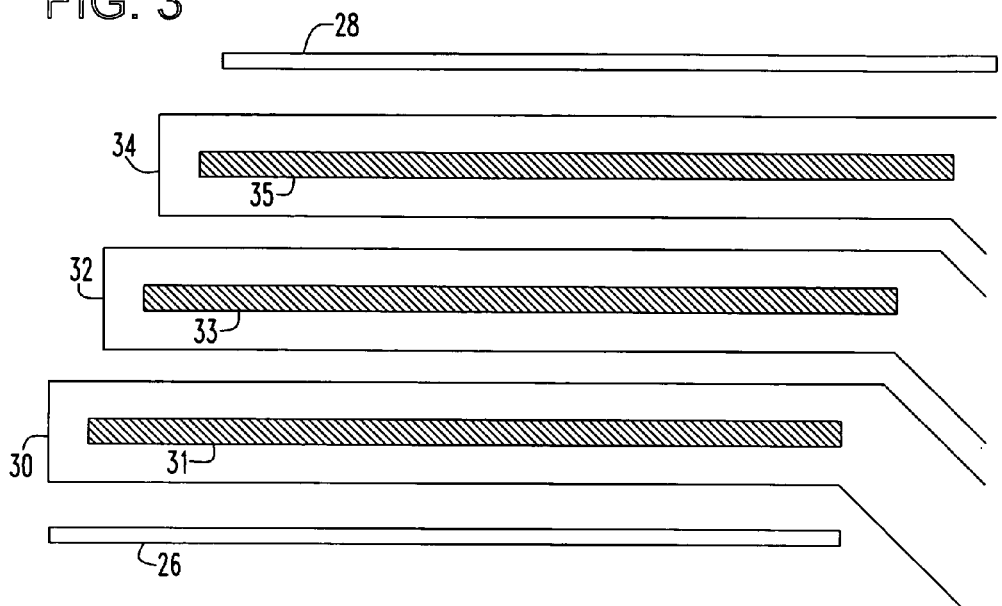
FIG. 3 further illustrates same tone and negative tone SRAFS, as placed in relation to main shapes of a mask.
Figure 4:
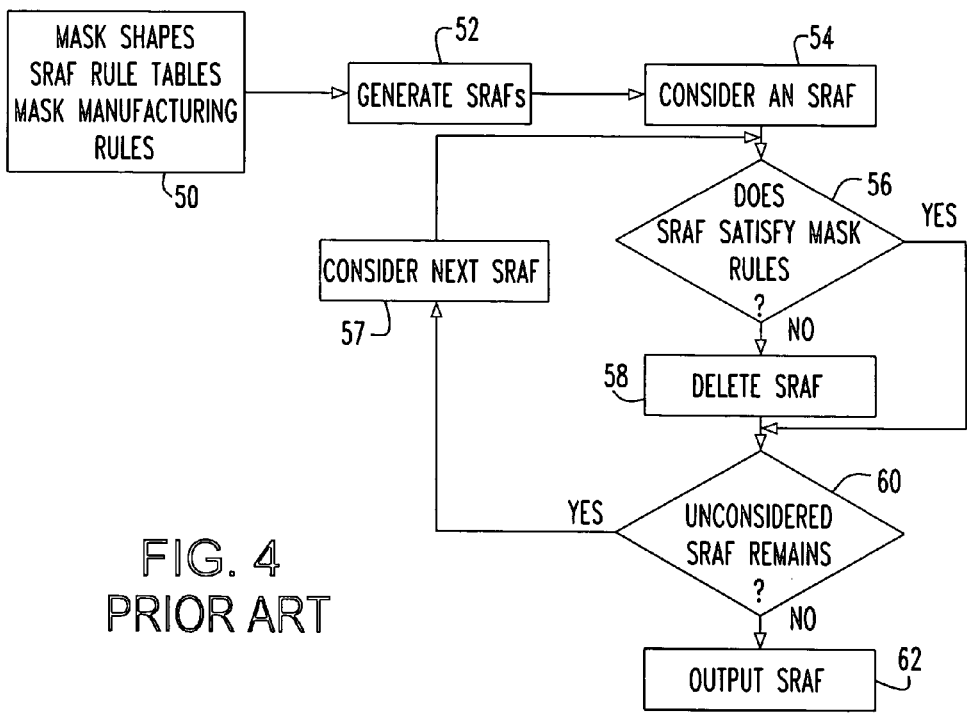
FIG. 4 illustrates a prior art mask clean-up process performed in relation to a set of SRAFS.
Figure 5A:
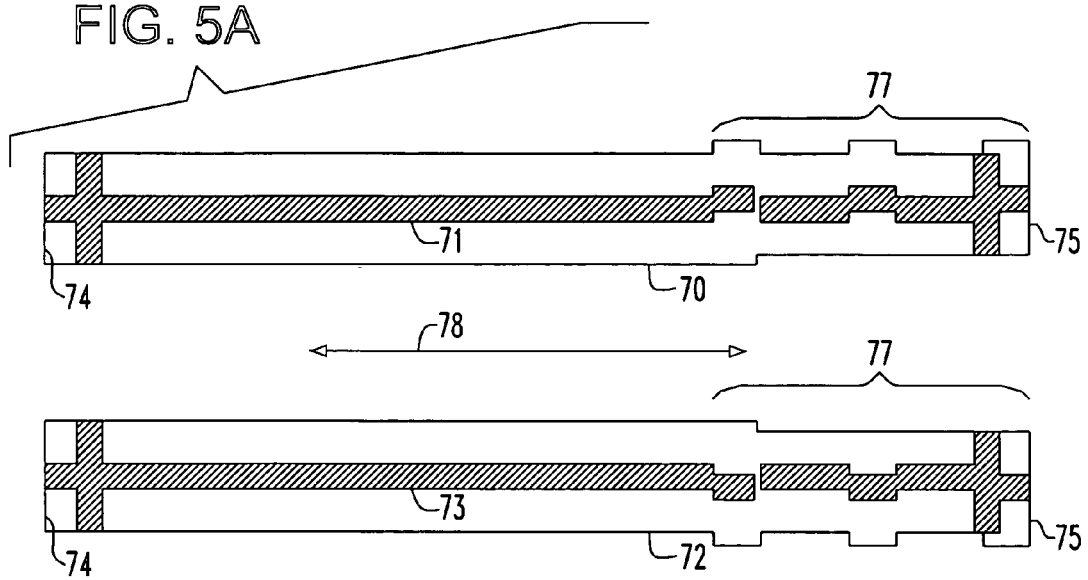
FIG. 5A illustrates exemplary mask shapes, in relation to which opposite tone SRAFs are provided.
Figure 5B:
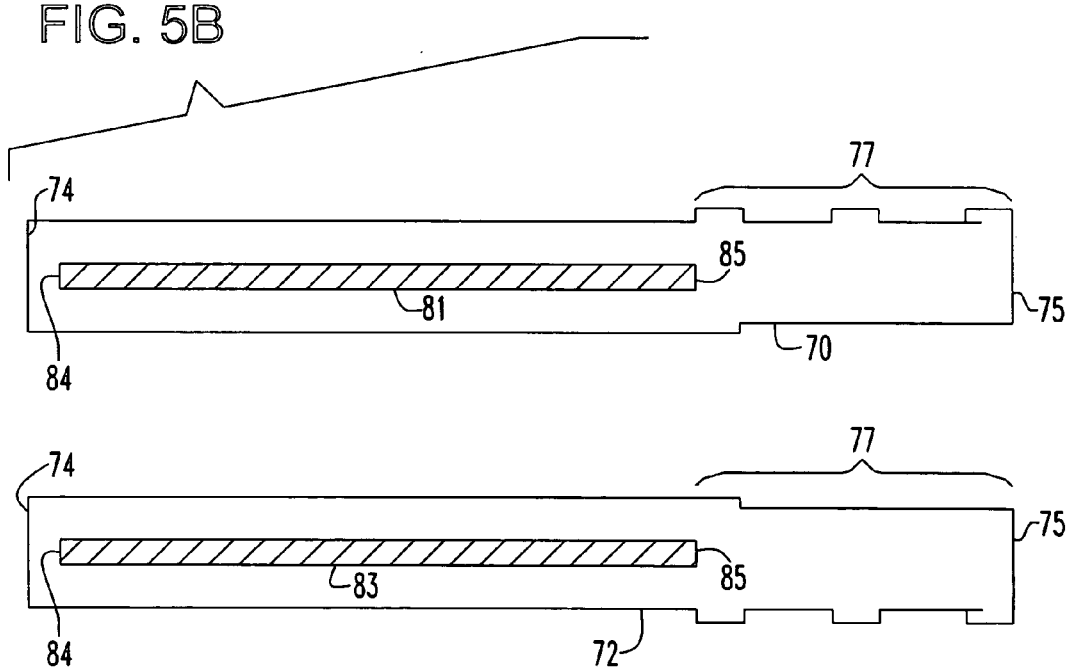
FIG. 5B illustrates the exemplary mask shapes of FIG. 5A and a set of opposite tone SRAFs resulting from a clean-up process performed according to FIG. 4.
Figure 6:
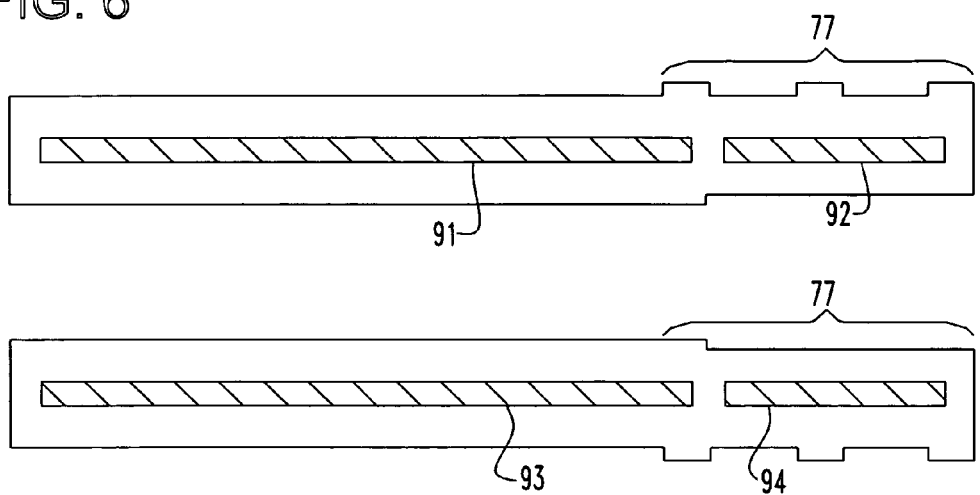
FIG. 6 illustrates exemplary mask shapes and a set of desired SRAFS to result after a clean-up process is performed according to FIG. 4.
Figure 7:
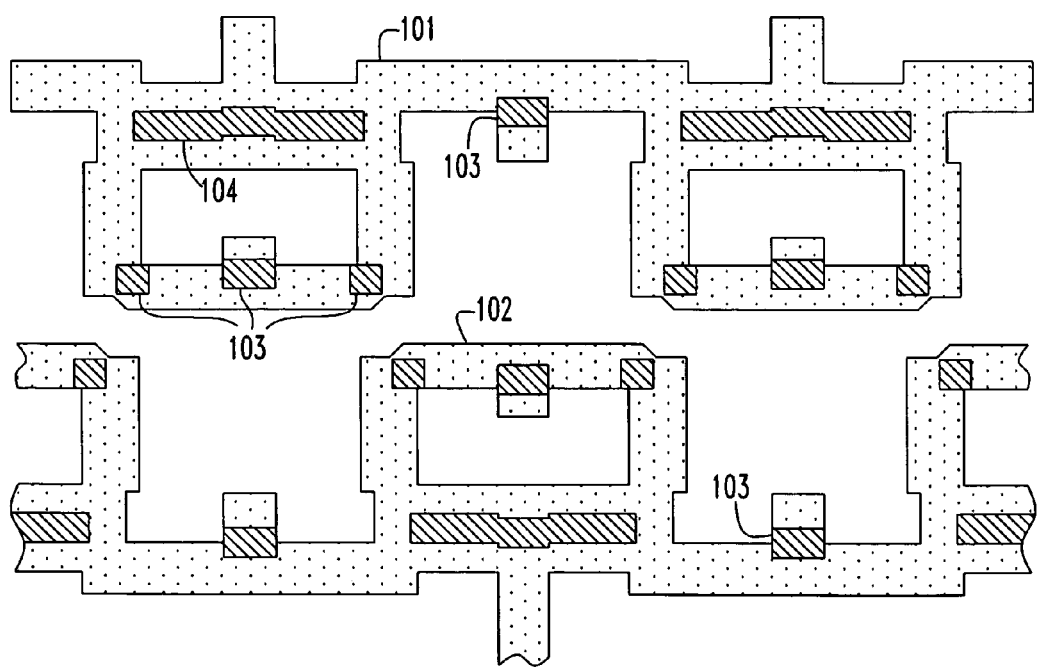
FIG. 7 is a further example illustrating a set of main mask shapes and SRAFs prior to performing a clean-up process.
Figure 8:
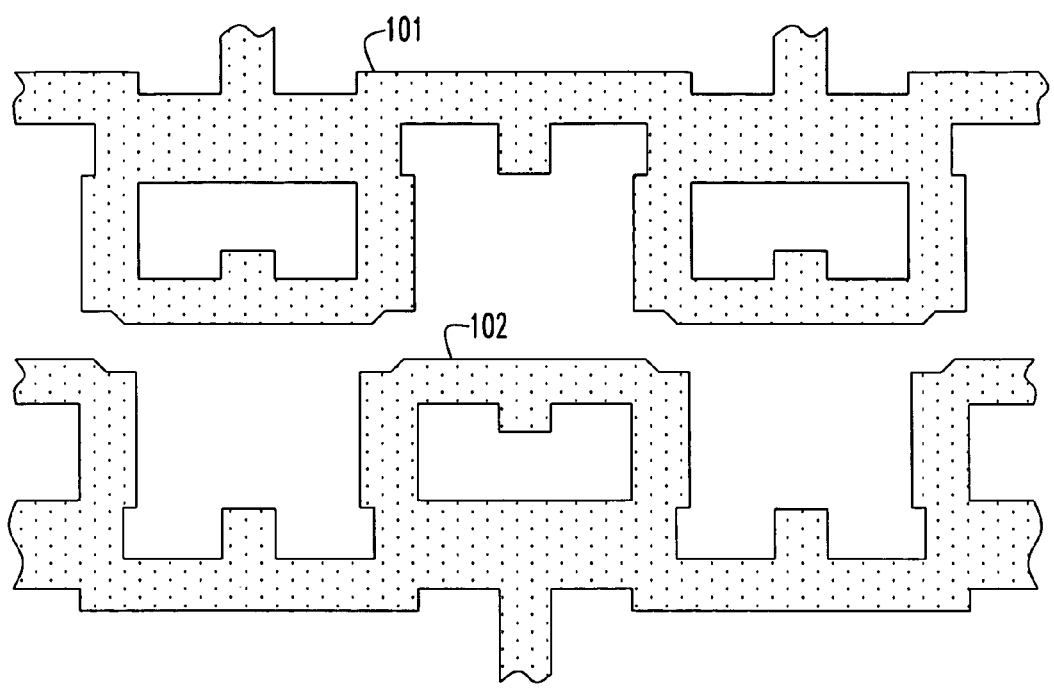
FIG. 8 illustrates a result, showing no remaining SRAFS, after a clean-up process is performed to the shapes shown in FIG. 7.
Figure 9:
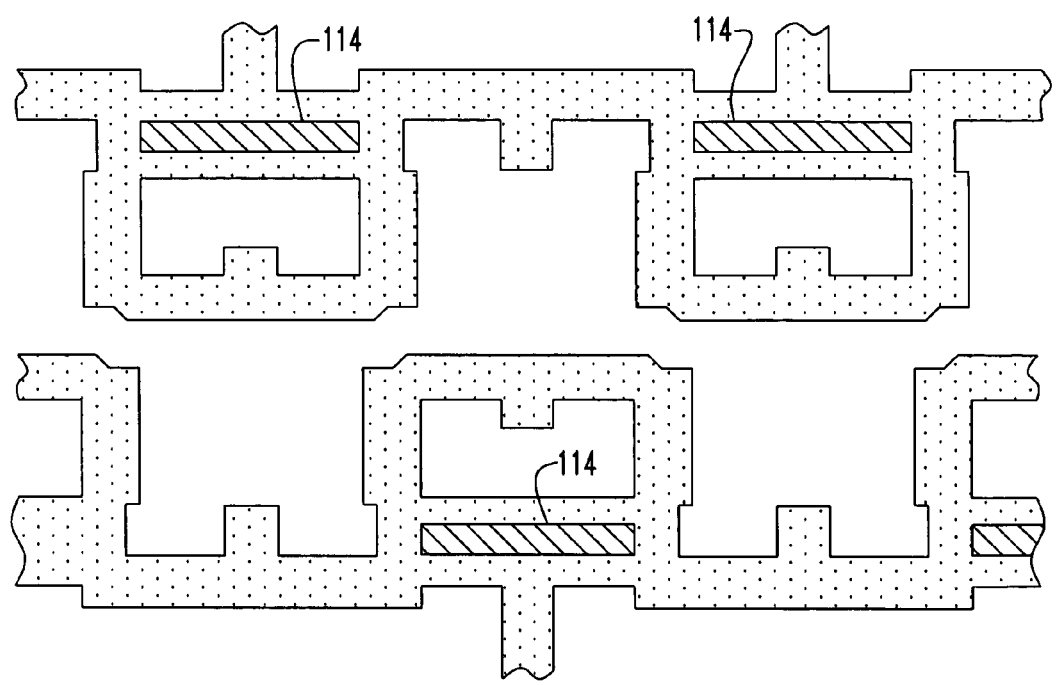
FIG. 9 illustrates a desired result in which SRAFs remain following a clean-up process performed to the shapes shown in FIG. 7.

Thereafter, SRAFs are generated on the mask for assisting the main mask shapes that are provided by the method illustrated relative to blocks 700 through 750. In an embodiment of the invention, the process by which the SRAFs are generated and corrected by design-rule checking thereafter, as shown at blocks 760, 762, 766, 767, 768, 770 and 772 is the same as that described above with respect to corresponding blocks of FIG. 4. By performing the method according to an embodiment of the invention, a set of smoothed versions of main mask shapes are provided, in relation to which associated mask shapes such as SRAFs are provided which are more likely to remain after the corrective design-rule checking performed at blocks 762 et seq.

Many alternative embodiments of the invention are possible. First, it is not necessary that only geometric techniques such as the shrink and grow operations be applied to eliminate small features of the main mask shapes. Instead, mathematical techniques can be utilized to eliminate small features such as indentations and protrusions. Such techniques can be rule-based, e.g. such that the shape smoothing tool recognizes and eliminates such small features when traveling along the edges of features of the mask.

The principles and techniques of the invention can be applied not only to the generation of SRAFs but other associated or subordinate shapes of a mask, as well. For example, fill shapes of a mask, such as those which are intended to be printed on the wafer, and provided for the purpose of improving planarization using chemical mechanical polishing (CMP), are other examples of such associated shapes. Other examples include fill shapes which are printed on the wafer which perform no particular function on the wafer, except to improve the printing of the main mask shapes.

Further, as to the geometric techniques, in one embodiment, an initial shrink operation to shrink by the value X from each edge is performed, at block 720, followed by growth in one operation by the value 2X, in place of the two growth steps at blocks 732, 734, which is then followed by shrinking the shapes by the value X again, at block 740. In an alternative embodiment of the invention, instead of shrinking the mask shapes first before growing them, as indicated in blocks 720 and 730, the mask shapes are initially grown and then shrunk in an operation following the grow operation. Thereafter, instead of growing the shapes again, as in block 732 and shrinking them, at block 734, the mask shapes are then shrunk, followed by the grow operation.

In another embodiment, a value X is used during a first procedure in which a shrink operation is followed by a grow operation to remove protrusions from the main mask shapes. A value Y is used in place of the value X in a second procedure in which a grow operation is followed by a shrink operation to remove indentations from the main mask shapes. In such case, the values X and Y are optimized for each case of removing protrusions and indentations.

In yet another embodiment, multiple shrink operations and multiple grow operations are performed to remove indentations and protrusions, such as described above relative to FIG. 19 in which a grow operation is followed by two consecutive shrink operations and a final grow operation. In yet another variation, two consecutive shrink operations are followed by consecutive grow operations. In still another embodiment, an initial shrink operation is performed, followed by two consecutive grow operations, and then a final shrink operation is performed.

In another embodiment, a recording medium having a set of machine-readable instructions thereon is provided. The instructions encode any one of the above-described methods of providing associated shapes of a mask in relation to predetermined shapes of the mask. The storage medium may include any one of several various media: e.g., a magnetic disk, optical disc, magnetic or optical tape, etc., and/or any variety of electronic memory, whether the instructions are recorded thereon permanently or temporarily, and whether the method of movement of such medium by way of a portable medium, or by transfer and copying of information electronically from one location to another.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A method of generating an optical lithography mask, comprising:
   generating simplified mask patterns from predetermined main shapes eliminating detail from the predetermined main shapes while preserving geometrically relevant shape information in the simplified mask patterns;
   generating associated shapes relative to the simplified mask patterns; and
   generating the mask to include the predetermined main shapes and the associated shapes, wherein the step of generating the associated shapes relative to the simplified mask patterns increases the number of edges of the predetermined main shapes which are assisted by the associated shapes.

2. The method according to claim 1 wherein the associated shapes include sub-resolution assist features (SRAFs).

3. The method according to claim 1 wherein the associated shapes includes fill shapes.

4. The method according to claim 1 wherein the simplified mask patterns are generated through geometric manipulation.

5. The method according to claim 4 wherein the simplified mask patterns are generated for each of the predetermined main shapes by:
   a) defining a quantity X based on the critical dimension of the predetermined main shape and the lithographic process;
   b) shrinking every side of the predetermined main shape by the quantity X at least once to produce a resulting shape;
   c) growing every side of the resulting shape by the quantity X at least once to produce a grown resulting shape;
   d) preserving a common region between the predetermined main shape and the grown resulting shape as the simplified mask pattern; and,
   e) when any feature of the common region smaller than the quantity X remains, reducing the quantity X to provide a reduced guantity X and repeating said steps b) through e) using the reduced guantity X until no feature of the common region smaller than the reduced quantity X remains.

6. The method according to claim 5 wherein said step e) includes reducing the quantity X by a predetermined fraction of the quantity X.

7. The method according to claim 4 wherein, for each of the predetermined main shapes, said simplified mask patterns are generated by:
   a) defining a quantity X based on the critical dimension of the predetermined main shape and the lithographic process;
   b) shrinking every side of the predetermined main shape by the quantity X at least once to produce a resulting shape;
   c) growing every side of the predetermined main shape by the quantity X at least once to produce a first grown resulting shape;
   d) preserving a common region between the predetermined main shape and the first grown resulting shape;
   e) defining a quantity Y based on the critical dimension of the predetermined main shape and the lithographic process;
   f) growing every side of the first grown resulting shape by a quantity Y at least once to produce a second grown resulting shape;
   g) shrinking every side of the second grown resulting shape by the quantity Y at least once to produce a third resulting shape; and
   preserving a common region between the predetermined main shape and the third resulting shape as the simplified mask pattern.

8. The method according to claim 7 wherein X and Y are not equal.

9. The method according to claim 4 wherein said simplified mask patterns are generated for each of the predetermined main shapes by:
   a) defining a quantity X based on the critical dimension of the predetermined main shape and the lithographic process;
   b) growing every side of the predetermined main shape by the quantity X at least once to produce a resulting shape;
   c) shrinking every side of the resulting shape by the quantity X at least once to produce a shrunken resulting shape;
   d) preserving a common region between the predetermined main shape and the resulting shape after said shrinking and said growing as the simplified mask pattern; and
   e) when any feature of the common region smaller than the quantity X remains, reducing the quantity X to provide a reduced quantity X, growing every side of the common region by the reduced quantity X at least once to produce the resulting shape and repeating said steps c) through e) using the reduced quantity X until no feature smaller than the reduced quantity X remains.

10. The method according to claim 4 wherein, for each of the predetermined main shapes, said simplified mask patterns are generated by:
    a) defining a quantity X based on the critical dimension of the predetermined main shape and the lithographic process;
    b) shrinking every side of the predetermined main shape by the quantity X at least once to produce a resulting shape;
    c) growing every side of the predetermined main shape by the quantity X at least once to produce a first grown resulting shape;
    d) preserving a common region between the predetermined main shape and the first grown resulting shape;
    e) defining a quantity Y based on the critical dimension of the predetermined main shape and the lithographic process;

f) growing every side of the first grown resulting shape by a quantity Y at least once to produce a second grown resulting shape;

g) shrinking every side of the second grown resulting shape by the quantity Y at least once to produce a third resulting shape; and h) preserving a common region between the predetermined main shape and the third resulting shape as the simplified mask pattern.

11. The method according to claim 1 wherein the simplified mask patterns are generated mathematically through application of rules.

12. The method according to claim 11, wherein the rules provide for removal of indentations having one or more edges smaller than a predetermined dimension.

13. The method according to claim 11, wherein the rules provide for removal of protrusions having one or more edges smaller than a predetermined dimension.

14. The method according to claim 1, wherein said step of generating the associated shapes increases coverage of the predetermined main shapes by the associated shapes in accordance with a product of the number of the assisted edges of the predetermined main shapes and the length of the assisted edges of the predetermined main shapes.

15. A method of generating an optical lithography mask, comprising:
  a) for each of a plurality of predetermined main shapes defining a quantity X based on the critical dimension of the predetermined main shape and the lithographic process;
  b) shrinking every side of the predetermined main shape by the quantity X at least once to produce a resulting shape;
  c) growing every side of the resulting shape by the quantity X at least once to produce a grown resulting shape;
  d) preserving a common region between the predetermined main shape and the grown resulting shape as the simplified mask pattern; and,
  e) when any feature of the common region smaller than the quantity X remains, reducing the quantity X, shrinking every side of the common region by the reduced guantity X at least once to produce the resulting shape and repeating said steps c) through e) using the reduced guantity X until no feature of the common region smaller than the reduced quantity X remains; and generating associated shapes relative to the simplified mask patterns; and generating the mask to include the predetermined main shapes and the associated shapes, wherein the step of generating the associated shapes relative to the simplified mask patterns increases the number of edges of the predetermined main shapes which are assisted by the associated shapes.

16. A recording medium have a set of computer-readable instructions recorded thereon, the instructions being executable by a processor to perform a method of generating an optical lithography mask, the method comprising:

generating simplified mask patterns from predetermined main shapes by eliminating detail from the predetermined main shapes while preserving geometrically relevant shape information; and generating associated shapes relative to the simplified mask patterns; and generating the mask to include the predetermined main shapes and the associated shapes, wherein the step of generating the associated shapes relative to the simplified mask patterns increases the number of edges of the predetermined main shapes which are assisted by the associated shapes.

17. The recording medium according to claim 16 wherein for each of the predetermined main shapes, said step of generating simplified mask patterns includes:
  a) defining a quantity X based on the critical dimension of the predetermined main shape and the lithographic process;
  b) shrinking every side of the predetermined main shape by the quantity X at least once to produce a resulting shape;
  c) growing every side of the resulting shape by the quantity X at least once to produce a grown resulting shape;
  d) preserving a common region between the predetermined main shape and the grown resulting shape as the simplified mask pattern; and,
  e) when any feature of the common region smaller than the quantity X remains, reducing the quantity X, shrinking every side of the common region by the reduced guantity X at least once to produce the resulting shape and repeating said steps c) through e) using the reduced guantity X until no feature of said common region smaller than the reduced quantity X remains.

* * * * *